United States Patent

Kittl et al.

Patent Number: 6,046,105
Date of Patent: Apr. 4, 2000

[54] PREFERENTIAL LATERAL SILICIDATION OF GATE WITH LOW SOURCE AND DRAIN SILICON CONSUMPTION

[75] Inventors: Jorge Adrian Kittl, Plano; Qi-Zhong Hong, Dallas, both of Tex.

[73] Assignee: Texas Instruments Incorporated, Dallas, Tex.

[21] Appl. No.: 09/060,970

[22] Filed: Apr. 15, 1998

[51] Int. Cl.[7] ................................................... H01L 21/28
[52] U.S. Cl. ........................ 438/655; 438/303; 438/305; 438/299; 438/664; 438/683
[58] Field of Search ................................. 438/655, 592, 438/656, 657, 660, 663–664, 682, 683–685, 706, 712, 299–307

[56] References Cited

U.S. PATENT DOCUMENTS

| | | | |
|---|---|---|---|
| 4,356,623 | 11/1982 | Hunter | 29/571 |
| 4,663,191 | 5/1987 | Choi et al. | 427/93 |
| 4,735,680 | 4/1988 | Yen | 156/643 |
| 4,746,219 | 5/1988 | Holloway et al. | 357/23.11 |
| 4,855,247 | 8/1989 | Ma et al. | 437/44 |
| 5,196,360 | 3/1993 | Doan et al. | 437/41 |
| 5,547,881 | 8/1996 | Wang et al. | 438/384 |
| 5,672,544 | 9/1997 | Pan | 438/305 |
| 5,726,479 | 3/1998 | Matsumoto et al. | 257/412 |
| 5,739,573 | 4/1998 | Kawaguchi | 257/384 |
| 5,851,921 | 4/1997 | Gardner et al. | 438/655 |
| 5,889,331 | 3/1999 | Bai | 257/768 |

OTHER PUBLICATIONS

1995 IEEE, "3D Modeling of Sputter and Reflow Processes for Interconnect Metals", pp. 4.4.1–4.4.4 (F. H. Baumann and G. H. Gilmer).
1994 IEEE, "Aluminum–Germanium–Copper Multilevel Damascene Process Using Low Temperature Reflow Sputtering and Chemical Mechanical Polishing", pp. 5.2.1–5.2.4 (K. Kikuta, Y. Hayashi, T. Nakajima, K. Harashima and T. Kikkawa).
1985 IEEE "Silicon Processing for the VLSI Era", pp. 397–399 (Stanley Wolf and Richard Tauber).
1980, Jul./Aug. American Vacuum Society, "Refractory Silicides for Integrated Circuits", pp. 775–792 (S.P. Murarka).

*Primary Examiner*—Charles Bowers
*Assistant Examiner*—Thanh Nguyen
*Attorney, Agent, or Firm*—Jacqueline J. Garner; Wade James Brady; Richard L. Donaldson

[57] ABSTRACT

Method of forming a salicide on a gate structure uses sidewall spacers which leave at least 30 percent of the gate sidewall exposed. After metal deposition, which has at least 50 percent step coverage, an anisotropic etch removes some or all of the metal on horizontal surfaces. Silicides formed from this metal layer are conformal, or even thicker on the sides of the gate than on horizontal structures. This achieves low sheet resistance on the gate, while remaining compatible with shallow junctions.

8 Claims, 2 Drawing Sheets

(OPTIONAL)

PREFERENTIAL LATERAL SILICIDATION OF GATE WITH LOW SOURCE AND DRAIN SILICON CONSUMPTION

BACKGROUND AND SUMMARY OF THE INVENTION

The present invention relates to integrated circuit structures and fabrication methods and more specifically to improving conductance on silicided polysilicon gate lines.

Even as the size of integrated circuits shrink, the demand for higher performance, including decreased resistance on conductive lines, increases. In logic integrated circuits, polysilicon gate lines commonly use a self-aligned silicide ("salicide") to reduce gate resistance and gate propagation delay. As device sizes shrink, smaller gate sizes mean that there are fewer nucleation centers for the transformation of titanium disilicide from a high resistance state (C49) to a low resistance state (C54), giving less desirable results. Further background in silicided gate structures can be found in *Silicon Processing for the VLSI Era*, Wolf et al., 1986 (see especially Volume 1, Chapter 11 on "Refractory Metals and Their Silicides in VLSI Fabrication" and Volume 2, Chapter 3 on "Contact Technology and Local Interconnects for VLSI"), which is hereby incorporated by reference.

Innovative Structures and Methods

Co-pending application Ser. No. 09/060,893, (Attorney Docket No. TI-21888), filed Apr. 15, 1998, and which is hereby incorporated by reference, discloses a method wherein the sidewall spacers adjacent a polysilicon gate are created to be lower in height than the gate, to expose at least 30 percent of the sidewall. This is followed by deposition of a metal, by a method which gives at least 50 percent step coverage, and heating to react the metal with exposed polysilicon to form a silicide. Since more of the gate is covered with silicide, the gate sheet resistance is lowered.

As is mentioned in the co-pending application, a further improvement to this silicidation process can be achieved by forming a silicide on the gate sidewalls which is thicker than the silicide on top of the gate. This is achieved by using an anisotropic metal etch after metal deposition, to thin the metal on horizontal surfaces, but not on the gate sidewall. This allows thin silicide formation on source and drain, with low silicon consumption, making it compatible with shallow junctions, and achieves low sheet resistance on the gates by thick silicide formation on the gate side walls.

Advantages of the disclosed method include:

lower sheet resistance on the gate;

thickness of silicide can be reduced over source/drain regions to protect shallow junctions;

silicide thickness is greater on sides of the gate, where it contributes to the desired low sheet resistance without causing the problems associated with thick suicides on source/drain regions;

process is highly manufacturable, easy to implement.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Presently Preferred Embodiment: Titanium Silicide

Figure 1:
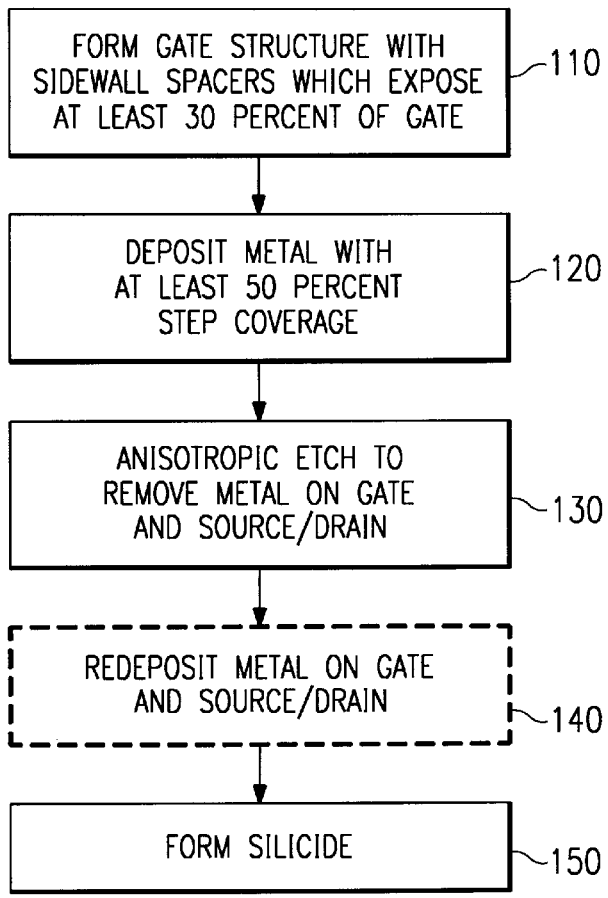
FIG. 1 shows a flowchart of the disclosed process.

FIG. 1 shows a flowchart of the disclosed process, including some portions discussed further in the co-pending application, and will be discussed in conjunction with FIGS. 2A–2E, which show various stages in the disclosed process.

Figure 2A:
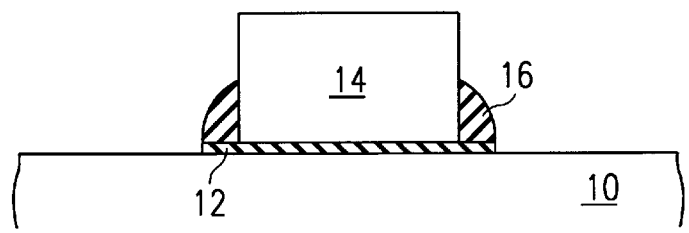
FIGS. 2A–2E show various steps in the disclosed process.
Figure 2B:
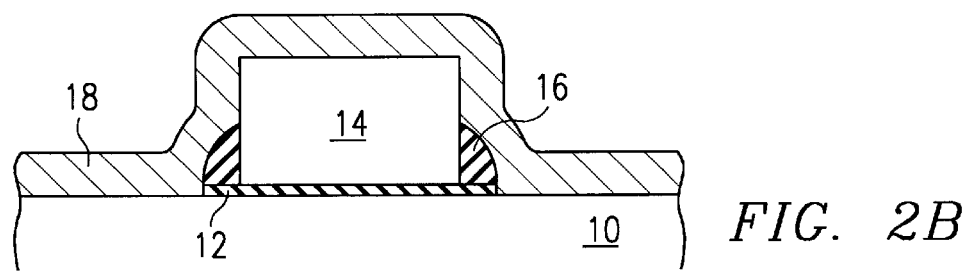

The process begins (step 110) with the formation of a polysilicon line 14, typically ranging from 100–500 nm thick, and preferably 250 nm, over a substrate 10 and gate oxide 12. This line will become a gate structure. Sidewall spacers 16 are formed, with a deliberate overetch in their formation, so that the sidewall spacers are shorter than the polysilicon line, exposing at least 30 percent (and preferably 50 percent), of the sidewall, as shown in FIG. 2A. CVD titanium 18 is then deposited (step 120) to a thickness of 15–40 nm on the horizontal surfaces, with a preferable thickness of 30 nm. This step preferably uses a TiI4 chemistry as a source gas; alternatively, TiCl4 can be used as the source gas. The structure at the end of this step is shown in FIG. 2B, which shows an ideal conformal deposition. However, CVD titanium deposition typically has a step coverage of 50–80%, so the sidewalls will have a correspondingly smaller thickness.

Figure 2C:
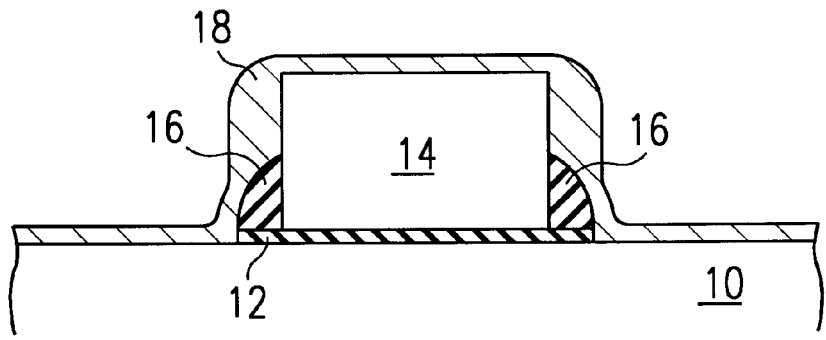

An anisotropic etch is then performed (step 130) to remove at least a portion of the titanium 18 from the horizontal portions of the wafer. In a sample embodiment, the titanium etch is performed using a SiCl4 source gas flow under electron cyclotron resonance conditions, but of course other recipes can alternatively be used. See e.g. Midha et al., "Anisotropic pattern transfer of fine resist features to silicon nitride via an intermediate titanium layer," 35 Microelectronic Engineering 99 (1997); Blumenstock et al., "Anisotropic reactive ion etching of titanium," 7 J. Vac. Sci. Tech. B 627 (1989); Unger et al., "Application of titanium RIE to the fabrication of nm-scale structures," 5 Microelectronic Engineering 279 (1986); all of which are hereby incorporated by reference. Note that this etch will include the source/drain regions, as well as the top of the gate structure. FIG. 2C shows the wafer after completion of the anisotropic etch and optional redeposition of metal.

The wafer is then heated in a nitrogen-containing atmosphere (step 150), so that the metal reacts with the underlying silicon to form a self-aligned silicide. Since the titanium or other metal is thicker on the sides of the gate than on the horizontal surfaces, less silicon is consumed in the source/drain regions for a given cross-sectioned area of a silicided gate. This allows for low sheet resistance of the silicided polysilicon line with small silicon consumption on source drain regions, thus supporting shallower junctions with no leakage. The completion of this step is shown in FIG. 2E, where the thickness "a" of the silicide on horizontal surfaces is less than thickness "b" on the vertical sidewalls.

Depending on the specific processes used, the transformation of the silicide from a high resistance state (C49) to a low resistance state (C54) can require a separate anneal step, although this may also occur S during other heating steps, or even happen during the same step in which the silicide is formed. Whenever this step takes place, the presence of silicide on the sides, as well as the top, of the gate means that more nucleation centers are available to be sure that this phase change proceeds to completion.

Second Embodiment: Titanium with Optional Further Deposition

Figure 2D:
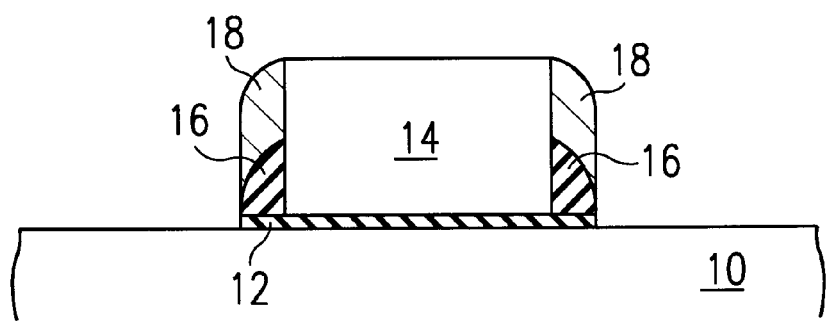
Figure 2E:
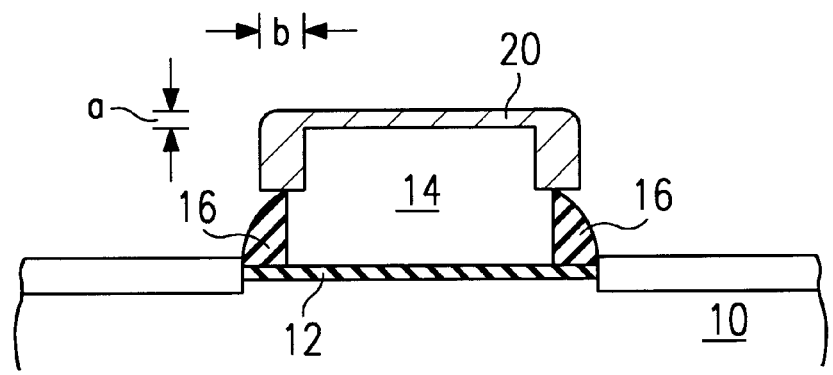

In this alternate embodiment, the etch completely removes titanium from the horizontal surfaces, as is shown in FIG. 2D. This step is followed by a further deposition of metal (step 140) to a thickness which is less than the original deposition, typically 20 nm for a junction depth Xj=100 nm, providing even greater thickness control. Other steps of the process are the same as disclosed above.

Third Embodiment: Titanium Silicide on Sidewalls Only

In this alternate embodiment, the etch completely removes titanium from the horizontal surfaces, but with NO subsequent metal deposition. In this embodiment, the silicide is formed only on the sidewalls of the gate structure. Other steps of the process are the same as disclosed above.

Fourth Embodiment: Tantalum Silicide

Titanium in the above embodiments can be replaced with CVD tantalum, to form a tantalum silicide. Process parameters remain the same.

Fifth Embodiment: Tungsten Silicide

The disclosed process can also be used with tungsten. This process is similar to the salicide process described above with titanium, but using CVD tungsten. CVD tungsten gives an essentially 100 percent conformal deposition, so the anisotropic etch would produce a metal thickness, and a silicide thickness, which is greater on the gate sidewalls than on the top of the gate. However, since the resistivity of tungsten silicide is much greater than titanium silicide, this embodiment is less preferable.

According to a disclosed class of innovative embodiments, there is provided: A fabrication method for an integrated circuit, comprising the steps of: (a.) forming a patterned gate structure, of a polycrystalline material which is greater than 50 percent silicon, on a semiconductor substrate; (b.) forming dielectric sidewall spacers adjacent to said patterned gate structure, wherein said sidewall spacers expose more than 30 percent of the sidewall of said patterned gate structure; (c.) after step b), forming a first layer of metal over said patterned gate structure, said first layer of metal being at least half as thick on vertical surfaces of said patterned gate structure as on horizontal surfaces of said patterned gate structure; (d.) removing part of the thickness of said first layer of metal with an anisotropic etch; and (e.) heating said integrated circuit to form a layer of silicide.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the disclosed process has been explained using titanium, tantalum, or tungsten, the process can be used with other metals, such as cobalt, nickel, platinum, etc, to form silicides with desirable thicknesses on the top and sides of the gate.

The disclosed process used a polysilicon gate, but this is not necessary to the practice of the invention. The gate could be a stack of several layers, e.g., TiN sandwiched between two polysilicon layers, or polysilicon over a poly-Si/Ge stack, or the gate could be of another polycrystalline material, as long as it contains more than 50 percent silicon.

What is claimed is:

1. A fabrication method for an integrated circuit, comprising the steps of:
    (a.) forming a patterned gate structure, of a polycrystalline material which is greater than 50 percent silicon, on a semiconductor substrate;
    (b.) forming dielectric sidewall spacers adjacent to said patterned gate structure, wherein said sidewall spacers expose more than 30 percent of the sidewall of said patterned gate structure;
    (c.) after step b), forming a first layer of metal over said patterned gate structure, said first layer of metal being at least half as thick on vertical surfaces of said patterned gate structure as on horizontal surfaces of said patterned gate structure;
    (d.) removing part of a thickness of said first layer of metal with an anisotropic etch; and
    (e.) after step d) heating said integrated circuit to form a layer of silicide.

2. The method of claim 1, wherein said dielectric sidewall spacers expose approximately 50 percent of the sidewall of said patterned gate structure.

3. The method of claim 1, wherein said metal is titanium.

4. The method of claim 1, wherein step c) uses chemical vapor deposition (CVD) to form said first layer of metal.

5. The method of claim 1, wherein said layer of silicide is thicker on the sides of said patterned gate structure than on the top of said patterned gate structure.

6. The method of claim 1, wherein said layer of silicide has the same thickness on the sides of said patterned gate structure as on the top of said patterned gate structure.

7. The method of claim 1, wherein said step (d.) removes all said metal on horizontal surfaces of said integrated circuit.

8. A fabrication method for an integrated circuit, comprising the steps of:
    (a.) forming a patterned gate structure, of a polycrystalline material which is greater than 50 percent silicon, on a semiconductor substrate;
    (b.) forming dielectric sidewall spacers adjacent to said patterned gate structure, wherein said sidewall spacers expose more than 30 percent of the sidewall of said patterned gate structure;
    (c.) after step b), forming a first layer of metal over said patterned gate structure, said first layer of metal being at least half as thick on vertical surfaces of said patterned gate structure as on horizontal surfaces of said patterned gate structure;
    (d.) removing part of the thickness of said first layer of metal with an anisotropic etch;
    (e.) after step (d), forming a second layer of metal on said patterned gate structure, wherein said second layer is thinner than said first layer; and
    (f.) after step (e), heating said integrated circuit to form a layer of silicide.

* * * * *

UNITED STATES PATENT AND TRADEMARK OFFICE
CERTIFICATE OF CORRECTION

PATENT NO. : 6,046,105
DATED : April 4, 2000
INVENTOR(S) : Jorge Adrian Kittl and Qi-Zhong Hong It is certified that error appears in the above-identified patent and that said Letters Patent is hereby corrected as shown below:

On the title page, insert the following item:

--[60] Provisional application No. 60/045,149, April 30, 1997--.

Column 1, line 4, insert the following:

--CROSS REFERENCE TO RELATED APPLICATION
Reference is made to and priority claimed from U.S. provisional Ser. No. 60/045,149, filed April 30, 1997 entitled PREFERENTIAL LATERAL SILICIDATION OF GATE WITH LOW SOURCE AND DRAIN SILICON CONSUMPTION--.

Signed and Sealed this

Twenty-seventh Day of February, 2001

Attest:

NICHOLAS P. GODICI

Attesting Officer

Acting Director of the United States Patent and Trademark Office